(12) United States Patent
Martin et al.

(10) Patent No.: US 8,446,316 B2
(45) Date of Patent: May 21, 2013

(54) DEVICE FOR DISCRIMINATING THE PHASE AND THE PHASE VARIATION OF A SIGNAL

(75) Inventors: Nicolas Martin, Bourg les Valence (FR); Jean-Michel Perre, St Peray (FR)

(73) Assignee: Thales, Neuilly sur Seine (FR)

( * ) Notice: Subject to any disclaimer, the term of this patent is extended or adjusted under 35 U.S.C. 154(b) by 267 days.

(21) Appl. No.: 13/098,887

(22) Filed: May 2, 2011

(65) Prior Publication Data

US 2011/0285588 A1   Nov. 24, 2011

(30) Foreign Application Priority Data

May 21, 2010   (FR) .................................. 10 02152

(51) Int. Cl.
*G01S 19/29* (2010.01)
(52) U.S. Cl.
USPC .................................................. 342/357.68

(58) Field of Classification Search
USPC ....................................................... 342/357.68
See application file for complete search history.

(56) References Cited

U.S. PATENT DOCUMENTS 7,702,040 B1   4/2010   Yuan et al.
2005/0100106 A1   5/2005   Chen

FOREIGN PATENT DOCUMENTS

FR   2 913 773 A1   9/2008

*Primary Examiner* — Harry Liu
(74) *Attorney, Agent, or Firm* — Baker Hostetler LLP

(57) ABSTRACT

In a phase discriminator device for receiving, as input, a complex signal whose argument represents a phase error, and for producing, as output, an estimate of the phase error for each signal sample $Z_{n+1}$ received, the device includes a frequency discriminator and a computation part for determining the phase estimate obtained at an instant $(N+1)T_1$. The computation part determines the phase estimate according to predetermined relations, and $T_1$ is the time interval between two samples $Z_n$ and $Z_{n+1}$, received consecutively.

16 Claims, 13 Drawing Sheets

DEVICE FOR DISCRIMINATING THE PHASE AND THE PHASE VARIATION OF A SIGNAL

CROSS-REFERENCE TO RELATED APPLICATIONS

This application claims priority to foreign French patent application No. FR 10 02152, filed on May 21, 2010, the disclosure of which is incorporated by reference in its entirety.

FIELD OF THE INVENTION

The technical field of the invention is that of devices for demodulating a signal in a reception system for which an accurate estimation of the phase is required. The invention applies, for example, to satellite radionavigation systems for which the information contained in the phase of the signal helps in accurately determining the position of a receiver.

The invention relates to a device for discriminating or estimating the phase or phase error during the demodulation of a signal subject to significant phase variations, for example due to a rapid trend in the frequency due to the Doppler effect. In the subsequent description the use of the term Doppler frequency is made with reference to a frequency bias due to the velocity of the sender or receiver, with respect to the nominal frequency in the absence of motion of the carrier.

BACKGROUND OF THE INVENTION

The aim of a satellite radionavigation system is to determine the position of a receiver by using the principle of triangulation. The pseudo-distances measured on the basis of the signals received by three satellites are utilized to determine the position of the receiver.

In addition to the accuracy of positioning, two other parameters characterize the performance of a radio-navigation receiver: the capacity to operate with a low signal-to-noise ratio and the resilience to phase dynamics due to the motions of the carrier. In the case where the carrier is an aircraft, the accelerations of motion that it is liable to cause result in a significant Doppler frequency variation in the signals received by the receiver.

The means for demodulating the signals received by the receiver generally use the known phase-locked loop principle to accurately estimate the phase of the signals received so as to determine an accurate positioning. The performance of a phase-locked loop (PLL) is characterized notably by two criteria, its resilience to rapid variations in Doppler frequency and its capacity to operate at a low signal-to-noise ratio. A compromise is required between these two parameters, thus, the increase in resilience to Doppler frequency variations is achieved at the price of lower resistance to noise. Moreover, it requires an increase in the passband of the loop, thus giving rise to an overhead in terms of computational load for the receiver.

The resilience to dynamics of the known phase-locked loops is restricted by the phase discriminator which exhibits a limited linear span. The resilience to dynamics of a phase-locked loop represents its capacity to tolerate a significant change between two stationary states. In the case of slackness of the said loop, also called the carrier loop, during the transient phase between the two stationary states, the phase error may depart from the discriminator capture zone and this may give rise to the divergence of the loop and its dropout.

In order to increase the extent of the phase loop capture zone, it is known to implement a so-called "winder" discriminator which records the number of revolutions over the phase error, the consequence of which is that the capture zone becomes infinite in terms of phase error. It remains, however, limited in terms of frequency error or phase velocity error. This limitation is directly related to the sampling frequency used by the digital device which executes the loop. In a satellite radionavigation receiver, the limitation of the phase loop sampling frequency is related to the duration of coherent integration applied to demodulate the received signal.

This limit in terms of frequency may be penalizing in the case of applications, for example airborne, inducing large variations in phase velocity.

Another known solution is described in the applicant's French patent application No. 07 01931 which pertains to a device for receiving satellite signals comprising a phase loop with delay compensation. This solution makes it possible to increase the passband of the loop without rendering it unstable, the effect of which is to increase the resilience to swing of the loop without increasing the system pre-detection band, therefore without overburdening the computational load of the loops.

However, this solution, although making it possible to reduce the slackness of the phase loop and thus to improve the resilience to dynamics does not change the operating limit in terms of frequency of the discriminator which still constitutes the limiting factor.

Another known solution consists in making direct use of a frequency-locked loop but in this case, the phase measurement is much less accurate, this being penalizing to performance in terms of accuracy and integrity of the positioning measurement.

SUMMARY OF THE INVENTION

The invention substantially increases the resilience to phase dynamics without increasing the operating point in terms of signal-to-noise ratio of the system and while limiting the computational load.

The present invention alleviates the limitations of the aforementioned known solutions by using a frequency-extended winder discriminator.

The invention includes a phase discriminator device receiving as input a complex signal whose argument represents a phase error $\Delta\phi$ and producing as output an estimate $\theta_{n+1}$ of the phase error $\Delta\phi$ for each signal sample $Z_{n+1}$ received, comprising computation means suitable for determining the phase estimate obtained at an instant $(N+1)T_1$ according to the following relations:

$$\theta_{n+1} = \theta_n + \Delta\theta_{n+1} + \Delta\theta'_{n+1}$$

$$\Delta\theta'_{n+1} = Discri_{Frequency}(n+1) \cdot 2\pi \cdot T_1$$

$$\Delta\theta_{n+1} = \arctan(I'_{n+1}, Q'_{n+1})$$

$$I'_{n+1} + jQ'_{n+1} = Z_{n+1} \cdot Z'^*_{n+1}$$

$$Z'_{n+1} = \exp(j\Delta\theta'_{n+1}) \cdot Z_n$$

where $T_1$ is the time interval between two samples $Z_n$ and $Z_{n+1}$ received consecutively, $Discri_{Frequency}(n+1)$ is an estimate of the frequency error $\partial\Delta\phi/\partial t$ of the complex signal produced by a frequency discriminator that the device comprises, and $Z'^*_{n+1}$ is the complex conjugate of $Z'_{n+1}$.

In embodiments of the invention, the discriminator device furthermore comprises first means of coherent integration of the signal producing from M complex signal samples $Z_{n,k}$ at the frequency $F'_e = 1/T_0$ a complex sample $Z_n$ at the frequency $F_e = 1/T_1$, each time interval of duration $T_1$ being subdivided into M time intervals of duration $T_0$, the frequency discriminator determining the frequency error estimate $\text{Discri}_{frequency}(n)$ on the basis of the samples $Z_{n,k}$.

In another embodiment of the invention, the frequency discriminator comprises at least first means for computing at least two frequency error hypotheses at frequencies $-F_0$ and $+F_0$ with $F_0 = F_e/2$:

$$Z_{+1}(n) = \sum_{k=0}^{M-1} Z(n,k) e^{+j\pi \frac{k}{M}}$$

$$Z_{-1}(n) = \sum_{k=0}^{M-1} Z(n,k) e^{-j\pi \frac{k}{M}},$$

and second means for computing the frequency error estimate according to the following two relations:

$$\text{Discri}_{Frequency}(n) = \frac{\{\|Z_{+1}(n)\|^2 - \|Z_{-1}(n)\|^2\}}{(32 CT_1/\pi^2)} \text{ or}$$

$$\text{Discri}_{Frequency}(n) = \frac{Re[(Z_{+1}(n) - Z_{-1}(n)) \cdot Z_0(n)^*]}{(16 CT_1/\pi^2)}$$

with C the estimated power of the received signal and $Z_0(n) = Z_n$

In an embodiment of the invention, the frequency error estimate is replaced with the average of the frequency error estimates obtained at the instants n and n+1.

In another embodiment of the invention, the frequency error hypotheses are corrected with the frequency error estimate obtained at the previous instant:

$$Z_{+1}(n) = \sum_{k=0}^{M-1} Z(n,k) e^{+j\pi \frac{k}{M}} e^{-j2\pi \cdot \text{Discri}_{Frequency}(n-1)}$$

$$Z_{-1}(n) = \sum_{k=0}^{M-1} Z(n,k) e^{-j\pi \frac{k}{M}} e^{-j2\pi \cdot \text{Discri}_{Frequency}(n-1)}$$

and that the frequency error estimate determined at the instant n−1 is added to that obtained at the instant n.

In a variant embodiment of the invention, the said first computation means carry out a number 2S of frequency error hypotheses at the frequency values ranging from $-SF_0$ to $+SF_0$ in steps of $F_0$ according to the relations $$Z_{+p}(n) = \sum_{k=0}^{M-1} Z(n,k) e^{+j\pi p \frac{k}{M}} \text{ and}$$

$$Z_{-p}(n) = \sum_{k=0}^{M-1} Z(n,k) e^{-j\pi p \frac{k}{M}},$$

the said frequency discriminator furthermore comprises means for determining the index $p_0$ associated with the maximum value $\|Z_{p_0}(n)\|^2$ in the set $[-(S-1) \ldots, -2, -1, 0, 1, 2, \ldots (S-1)]$, with $Z_0(n) = Z_n$ and the frequency error estimate is determined according to one of the following two relations:

$$\text{Discri}_{Frequency}(n) = \frac{\{\|Z_{p_0+1}(n)\|^2 - \|Z_{p_0-1}(n)\|^2\}}{(32 CT_1/\pi^2)} + p_0 F_0 \text{ or}$$

$$\text{Discri}_{Frequency}(n) = \frac{Re[(Z_{p_0+1}(n) - Z_{p_0-1}(n)) \cdot Z_{p_0}(n)^*]}{(16 CT_1/\pi^2)} + p_0 F_0$$

In another embodiment of the invention, the phase discriminator device furthermore comprises means for estimating the signal-to-noise ratio $\hat{RSB}$, means for comparing the signal-to-noise ratio with a threshold predetermined as a function of a compromise between the extent of the frequency range of the device and its resistance to noise and means for deactivating and activating the frequency discriminator as a function of the result of the comparison.

In another embodiment of the invention, the phase discriminator device further comprises means for estimating the noise power $\sigma_b^2$, for example according to the relation $$\sigma_b^2 = \sum_{k=0}^{M-1} \|Z_b(n,k)\|^2,$$

with $Z_b(n,k)$ being measured noise samples and the signal-to-noise ratio being estimated according to one of the following relations:

$$\hat{RSB} = \frac{\|Z_{p_0}(n)\|^2}{\sigma_b^2} \text{ or } \hat{RSB} = \frac{\|Z_0(n)\|^2}{\sigma_b^2}.$$

The invention also includes a device for receiving satellite radionavigation signals receiving a continuous signal modulated by a carrier, of phase $\phi_{received}$, including means making it possible to generate a local carrier, of phase $\phi_{local}$, and means for demodulating and filtering the signal, furthermore including second means of coherent integration of the said signal which deliver as output M samples $Z_{n,k}$ at a sampling frequency $F'_e$ and a phase-locked loop comprising a one phase discriminator device according to the invention which receives as input a complex signal whose argument represents the phase error $\Delta\phi = \phi_{local} - \phi_{received}$ and which makes it possible to lock the phase $\phi_{local}$ of the local carrier onto that $\phi_{received}$ of the received carrier.

BRIEF DESCRIPTION OF THE DRAWINGS

The above and other aspects will become more readily apparent on reading the following detailed description given by way of nonlimiting example and taken in view of the accompanying drawings, in which.

DETAILED DESCRIPTION

Figure 1:
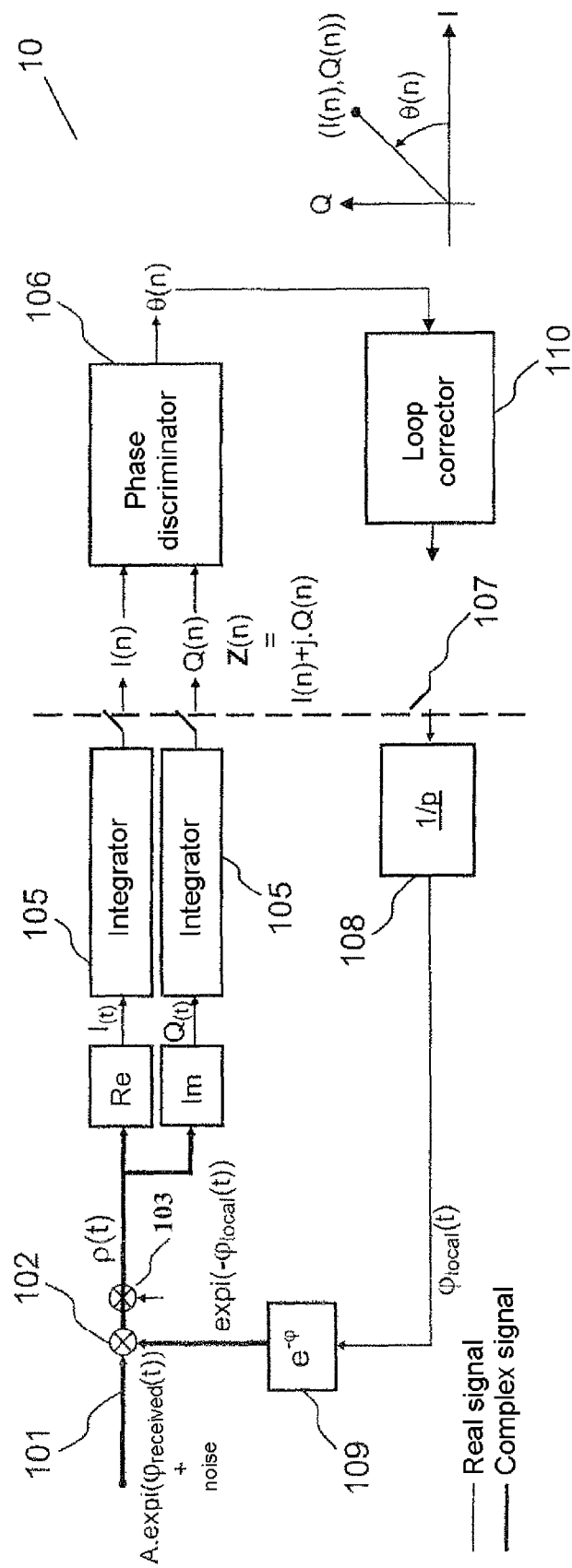
FIG. 1, a basic diagram of the demodulation means implemented by a satellite radionavigation receiver.

FIG. 1 shows diagrammatically the principle of the demodulation of the signal received by a satellite radionavigation receiver 10. The processing actions situated to the left of the dashed line constitute a continuous or discrete system with a high sampling frequency $F_c$, for example equal to 100 MHz. They are carried out preferably by integrated circuits of ASIC or FPGA type which are compatible with a high frequency such as this. The processing actions situated to the right of the dashed line constitute a system sampled at a low frequency, for example equal to 50 Hz, and are carried out by software, for example DSP signal processing software.

The received signal 101 is demodulated by a local carrier 109 of phase $\phi_{local}(t)$ by way of a complex multiplier 102. The term "local carrier" designates a signal generated locally at a second frequency different from that of the received signal, this second frequency being controlled by virtue of a digitally-controlled oscillator 108. A second demodulation 103 is also applied with the aim of demodulating the received signal with the local spreading code. Means 105 of coherent integration allow notably the filtering of the demodulated received signal 104. The complex signal $Z(n)=I(n)+jQ(n)$ thus obtained is transmitted to a phase discriminator 106 which produces as output an estimation $\theta_n$ of the phase error $\Delta\phi_n=\phi_{local}(n\cdot T)-\phi_{received}(n\cdot T)$ of the local carrier with respect to the phase of the carrier of the received signal. This estimation feeds a loop corrector 110. Such a corrector 110 can consist for example of an acceleration integrator which executes the following relation: $A(n+1)=A(n)+T\cdot K3\cdot\theta(n)$, associated with a velocity integrator which executes the following relation: $V(n+1)=V(n)+T\cdot A(n)+T\cdot K2\cdot\theta(n)$. The digitally-controlled oscillator 108 can also constitute a phase integrator executing the following relation: $\phi_{local}((n+1)\cdot T)= \phi_{local}(n\cdot T)+T\cdot V(n)+T\cdot K1\cdot\theta(n)$ if it receives as input a velocity control equal to: $V(n)+K1\cdot\theta(n)$. In this example, the phase loop thus produced is a $3^{rd}$-order loop since it contains three integrators. The acceleration integrator makes it possible to support a constant acceleration with no slackness error in the steady state. On the other hand in the transient state, subsequent to a change of acceleration, the phase slackness error may be significant and the discriminator 106 must be capable of following the maximum error without saturating so that the loop can return to a stationary state with no cycle skipping which would be prejudicial for the accuracy of the measurements The loop corrector 110 delivers a velocity control 107 which is produced as input to a digitally-controlled oscillator 108 which delivers at its output the phase of the local carrier $\phi_{local}(t)$. Thus the phase-locked loop implemented makes it possible to clamp the phase $\phi_{local}(t)$ of the local carrier onto the phase $\phi_{received}(t)$ of m the carrier of the received signal.

The known phase discriminators are of "winder" type. They exhibit a limitation because of the $2\pi$ ambiguity on the phase of the signal. When the phase error has altered by $\pi$ radians, i.e. half a revolution of a circle, between two measurement instants, an ambiguity in the sign of this error persists, namely $\pi$ or $-\pi$. By construction the discriminator 106 knows how to measure a phase error variation included in the interval $[+\pi-\pi[$. In the presence of a large variation in the phase, the discriminator measures a phase error equal to $(+\pi+\epsilon)$ as being equal to $(-\pi+\epsilon)$ thereby leading to an error of $2\pi$, liable to cause the loop to drop out.

As long as the variation in the phase error is strictly limited to $\pi$ in absolute value between two measurement instants the discriminator operates linearly. Beyond this the loop is liable to drop out. The limit of such a "winder" discriminator device in terms of phase velocity error (or phase error rate) is $\pi/T$ in radians per second or $\lambda/T$ in meters per second, $\lambda$ being the wavelength and T being the duration between two correlation samples, or else $\pi F_e$, with $F_e$ the sampling frequency of the device which executes the phase discriminator 106.

With such a device, resilience to a high phase velocity error can only be achieved by increasing the sampling frequency $F_e$ thereby giving rise to an increase in the computational load.

The received signal 101 can be obtained from a data channel or from a pilot channel. In the first case, the signal 101 is composed of a carrier modulated by a spreading code and by data. In the second case, the signal 101 is composed solely of a carrier and of a spreading code.

The spreading code is known to the receiver, contrary to the data which contain information about the position of the satellites.

Figure 2:
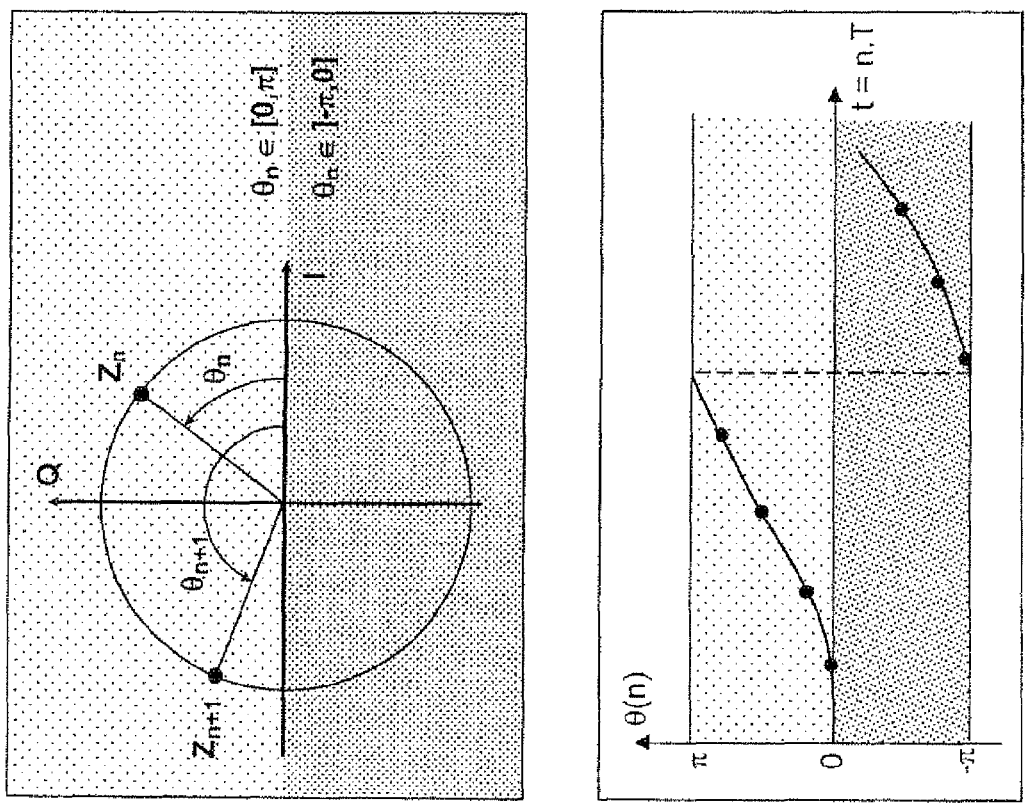
FIG. 2, an illustration of the operating principle of a phase discriminator of arctangent type according to the prior art applied to a pilot channel.

FIG. 2 illustrates the operating principle of a phase discriminator of arctangent type according to the prior art applied to a pilot channel.

At the top of the figure are represented two complex symbols $Z_n$ and $Z_{n+1}$ in the complex plane (I,Q) and their respective phases $\theta_n$ and $\theta_{n+1}$. The two symbols correspond to two successive samples of the complex signal obtained as output from the means 105 of coherent integration which allow the filtering of the received signal after demodulation by the local carrier and the local code. The estimate of the phase error $\theta_n$ is obtained by computing the arctangent between the real part and the imaginary part of the symbol $Z_n$. At the bottom of FIG. 2 is represented the trend of the phase estimate $\theta_n$ as a function of time $t=nT=n/F_e$. It can be seen that the output of the discriminator is limited between the values $\pi$ and $-\pi$ in radians, thereby reducing the robustness of the loop to phase velocity variations. When the slackness error exceeds $\pi$ radians, the loop may diverge and therefore drop out because of the feedback action at the output of the corrector which may change sign.

Figure 3:
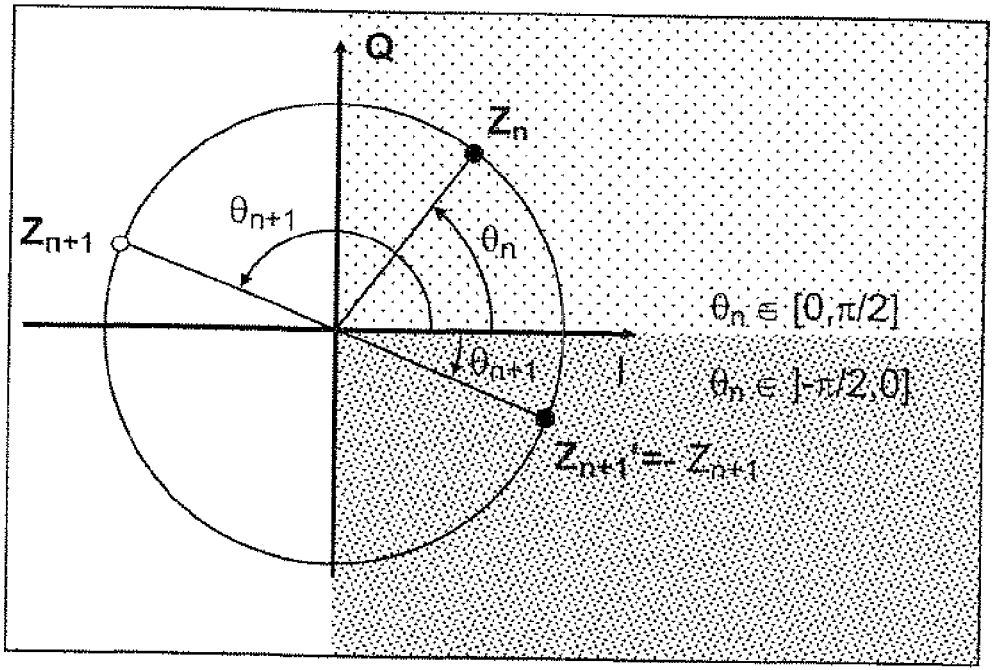
FIG. 3, an illustration of the operating principle of a phase discriminator of arctangent type according to the prior art applied to a data channel.
Figure 3:
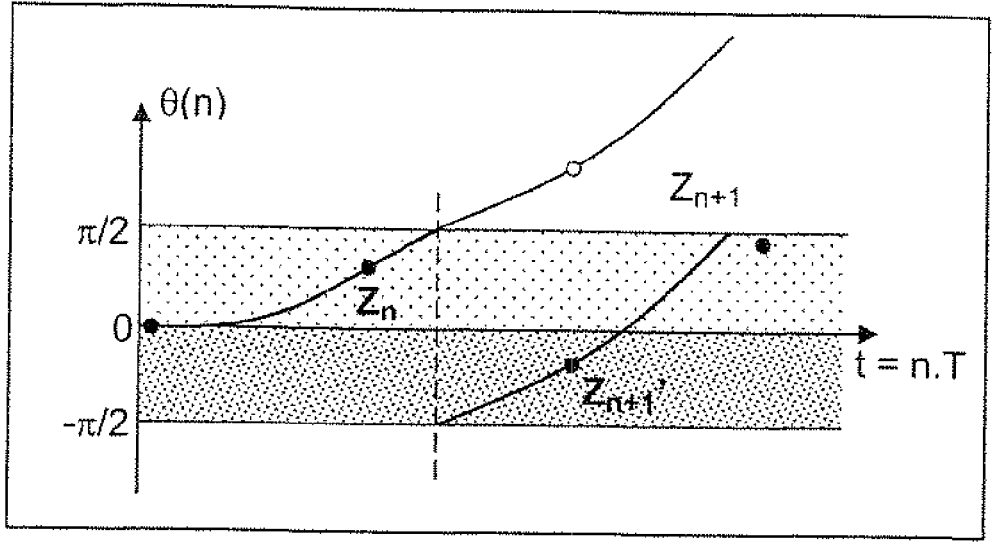

FIG. 3 illustrates the operating principle of a phase discriminator of arctangent type according to the prior art applied to a data channel.

In this second example, the symbols $Z_n$, $Z_{n+1}$ obtained after coherent integration 105 over the interval $[nT, (n+1)T]$ coincide with binary data $[-1, +1]$ which modulate the signal. These data are not known to the receiver, thus a change of sign of the data at the instant $(n+1)T$ will result in a change of sign between $Z_n$ and $Z_{n+1}$ that must not be confused with a phase variation. The consequence is that the output of the discriminator is now limited to the interval $[-\pi/2, \pi/2]$ as illustrated at the bottom of FIG. 3.

The principle of the "winder" phase discriminator according to the prior art consists in using the measured phase error $\theta_n$ as reference to resolve the ambiguity in the phase error $\theta_{n+1}$ and remove the limitations of the discriminator of arctangent type.

We have $\theta_{n+1}=\theta_n+\Delta\theta_{n+1}$ with $\Delta\theta_{n+1}=\text{arctangent}(I_{n+1}', Q_{n+1}') \in ]-\pi, \pi]$ and $Z'_{n+1}=I_{n+1}'+j\,Q_{n+1}'=Z_{n+1}\cdot Z_n^*$ with $Z_{n+1}=(I_{n+1}+j\,Q_{n+1})$, $Z_n=(I_n+j\,Q_n)$ and $Z_n^*=(I_n-j\,Q_n)$ the conjugate value of $Z_n$.

Figure 4:
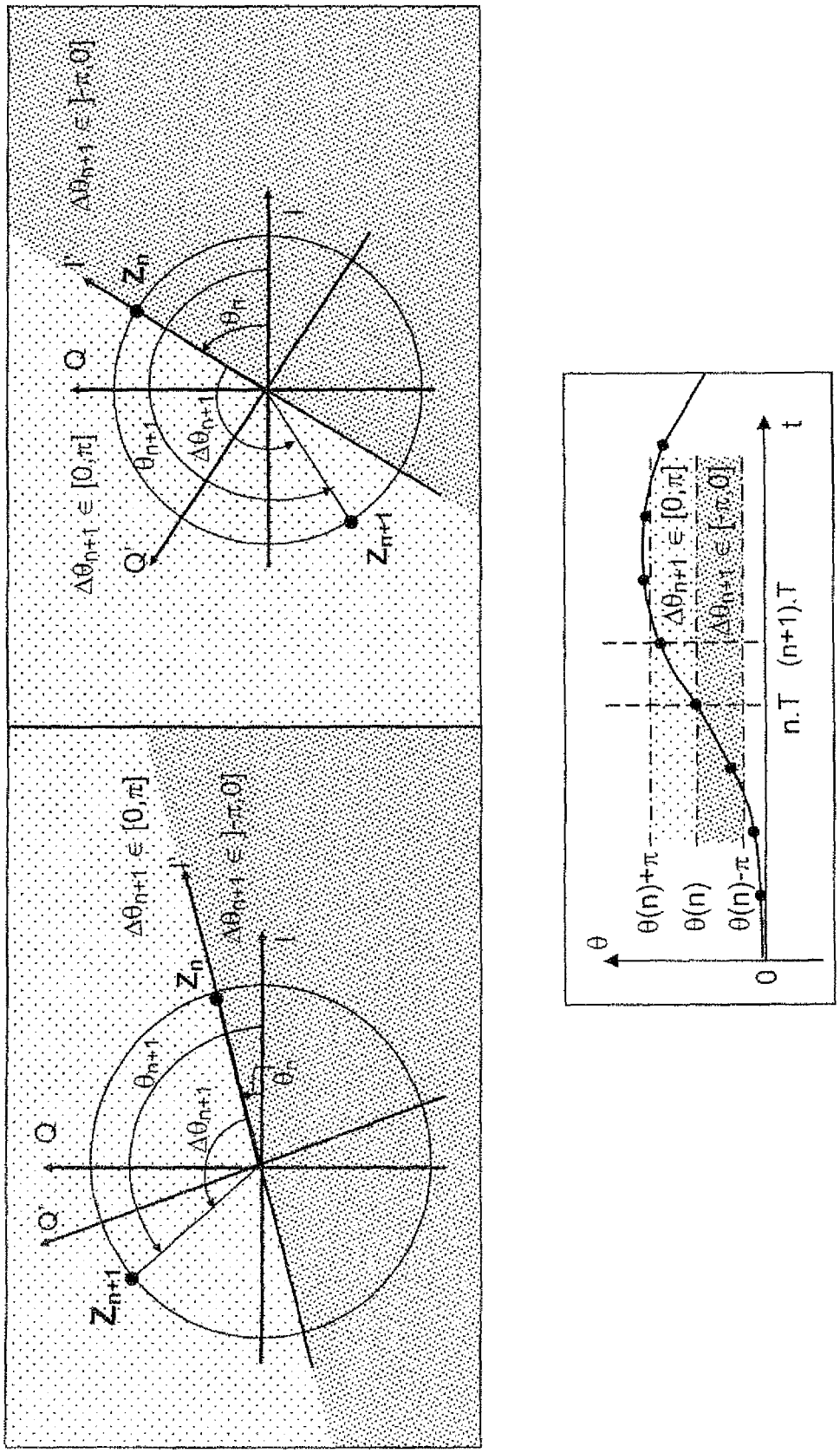
FIG. 4, an illustration of the operating principle of a "winder" phase discriminator according to the prior art applied to a pilot channel, in the case where the phase loop does not drop out.

FIG. 4 illustrates two examples for which the "winder" phase discriminator according to the prior art, applied to a pilot channel, operates without dropout. In these two examples, the phase jump $\Delta\theta_{n+1}$ between two consecutive symbols is less than $\pi$ in absolute value. The trend of the phase $\theta_n$ as a function of time is continuous and does not cause any dropout.

Figure 5:
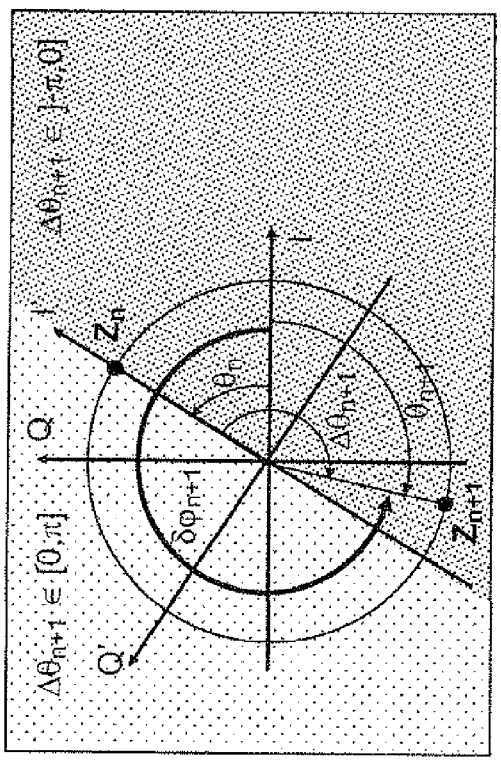
FIG. 5, an illustration of the operating principle of a "winder" phase discriminator according to the prior art applied to a pilot channel, in the case where the phase loop drops out.
Figure 5:
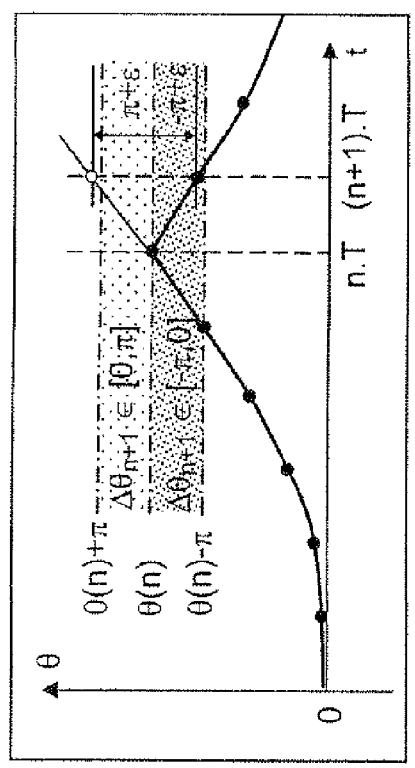

FIG. 5 presents an example for which the phase jump between the two consecutive symbols $Z_n$ and $Z_{n+1}$ is greater than $\pi$ in absolute value. In this case, and as illustrated in the bottom part of FIG. 5, the output of the phase discriminator is no longer limited in itself. On the other hand, a limit persists in the variation of the phase error $\Delta\phi_n$ between two measurements. As long as this variation remains lower in absolute value than $\pi$ then operation is linear as illustrated in the bottom part of FIG. 4 and the phase loop does not drop out. On the other hand if this variation exceeds $\pi$ in absolute value then $\theta_{n+1}$ no longer reflects the real phase error $\Delta\phi_{n+1}=\phi_{local}((n+1)\cdot T)-\phi_{received}((n+1)\cdot T)$ and the phase loop may drop out.

Figure 6:
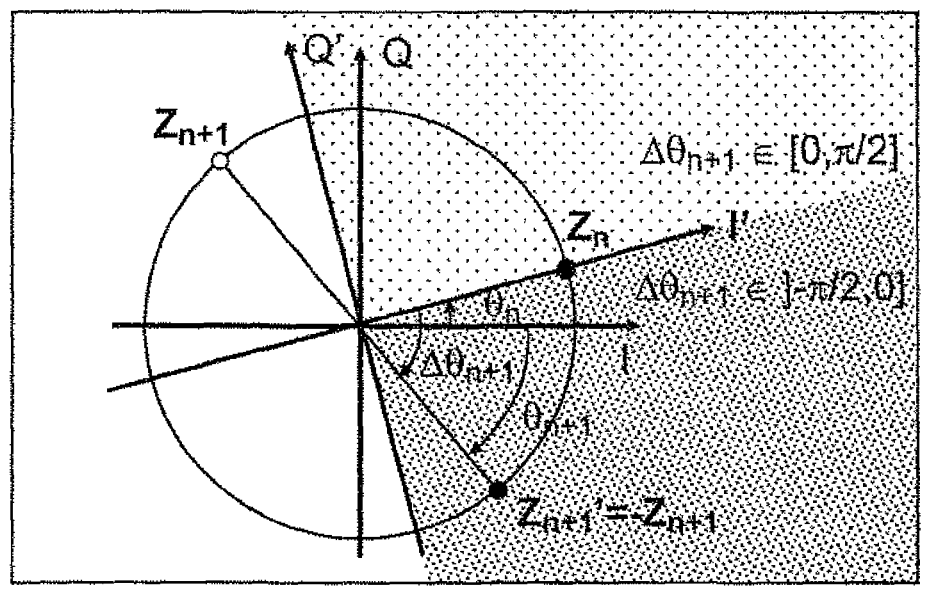
FIG. 6, an illustration of the operating principle of a "winder" phase discriminator according to the prior art applied to a data channel.
Figure 6:
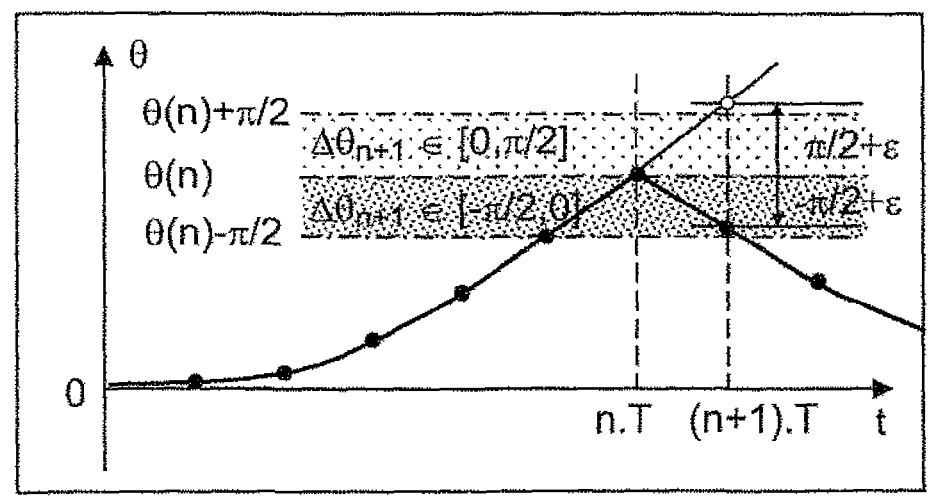

FIG. 6 illustrates the operation of the "winder" phase discriminator applied to a data channel for which the phase jump limitation is now equal to $\pi/2$ in absolute value. Because of the ambiguity in the sign of $Z_{n+1}$ due to the modulation by the data, we refer to the right half-plane limited by the perpendicular to the axis I' which contains the symbol $Z_n$. This amounts to limiting $\Delta\theta_{n+1}$ in the interval $]-\pi/2, \pi/2]$, thus reducing by two the tolerance limit in terms of Doppler frequency error.

We have $\theta_{n+1}=\theta_n+\Delta\theta_{n+1}$, $\Delta\theta_{n+1}=\text{arctangent}(Q_{n+1}'/I_{n+1}') \in [-\pi/2, \pi/2]$
with $I_{n+1}'+j\,Q_{n+1}'=Z_{n+1}\cdot Z_n^*$, $Z_{n+1}=(I_{n+1}+j\,Q_{n+1})$, $Z_n=(I_n+j\,Q_n)$ and $Z_n^*=(I_n-j\,Q_n)$ the conjugate value of $Z_n$.

The symbol $Z_{n+1}$ is estimated by such a discriminator as being the symbol $Z'_{n+1}=-Z_{n+1}$ for which the phase error $\Delta\theta_{n+1}$ which separates it from the previous symbol $Z_n$ is lower in absolute value than $\pi/2$.

Figure 7:
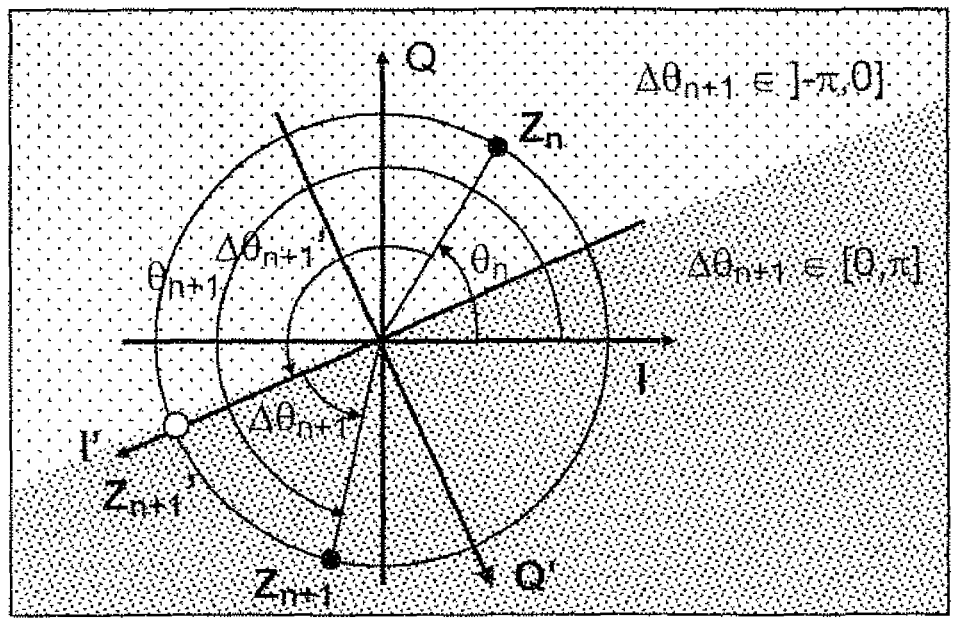
FIG. 7, an illustration of the operating principle of a phase discriminator according to the invention applied to a pilot channel.
Figure 7:
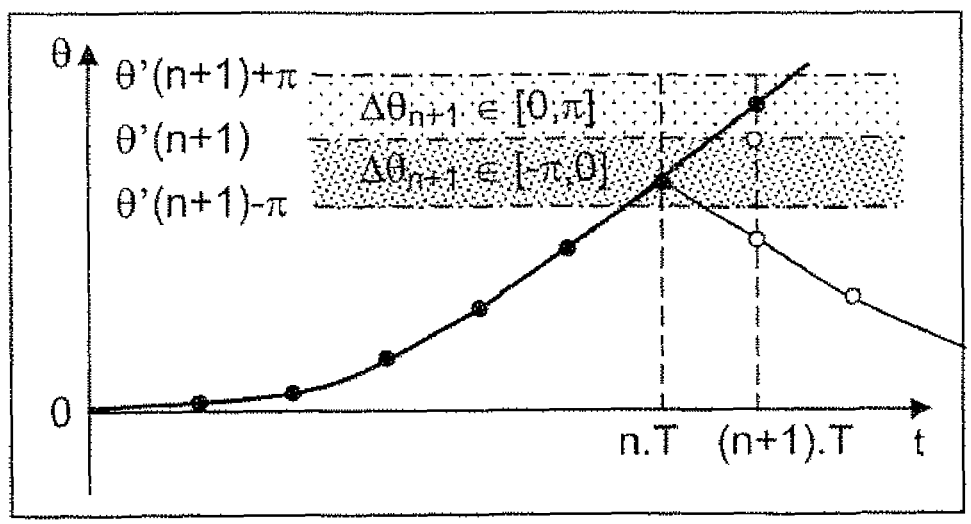

FIG. 7 illustrates the principle of a phase discriminator according to the invention.

In order to remove the limitation on the variation in phase error inherent to known phase discriminators, the present invention is based on the addition of a frequency discriminator making it possible to measure, upstream of the phase discriminator, the velocity of the phase error or Doppler frequency error.

Aspects of the invention may be explained with reference to the following relations and in accordance with the example of FIG. 7. Two consecutive symbols $Z_n$ and $Z_{n+1}$ are represented in the complex plane (I,Q). The phase jump between these two symbols is greater than $\pi$ thus corresponding to a typical case for which the known phase discriminators do not enable correct convergence of the phase loop to be ensured.

The invention includes using an intermediate symbol $Z'_{n+1}=\exp j(\Delta\theta_{n+1}')$. $Z_n$ constructed by virtue of a frequency discriminator which makes it possible to measure the Doppler frequency error $\partial\Delta\phi/\partial t$ or local carrier frequency error with respect to the frequency of the received carrier. The phase error $\Delta\theta_{n+1}'$ is obtained on the basis of the following relation:

$$\Delta\theta_{n+1}'=Discri_{Frequency}(n+1)\cdot 2\pi\cdot T=Discri_{Frequency}(n+1)\cdot 2\pi/F_e$$

where $Discri_{Frequency}(n+1)$ is an estimation of the mean Doppler frequency error (or variation of the phase error) between the instants $nT$ and $(n+1)T$.

The phase error between the two consecutive symbols can thus be decomposed into a first part $\Delta\theta_{n+1}'$ that can be predicted by virtue of the estimation of the Doppler frequency error and a second part $\Delta\theta_{n+1}$ which corresponds to the non-predictable phase error. This results in the following relations:

$$\theta_{n+1}=\theta_n+\Delta\theta_{n+1}'+\Delta\theta_{n+1} \quad (1)$$

with $\Delta\theta_{n+1}=\text{arctangent}(I'_{n+1}, Q'_{n+1}) \in ]-\pi, \pi]$ and $$I_{n+1}'+jQ_{n+1}'=Z_{n+1}\cdot Z_{n+1}'^* \quad (2)$$

The use of a frequency discriminator makes it possible to pre-correct the signal so as to refer the residual phase error $\Delta\theta_{n+1}$ to an interval $]-\pi, \pi]$ compatible with the operation of a "winder" phase discriminator.

Figure 8:
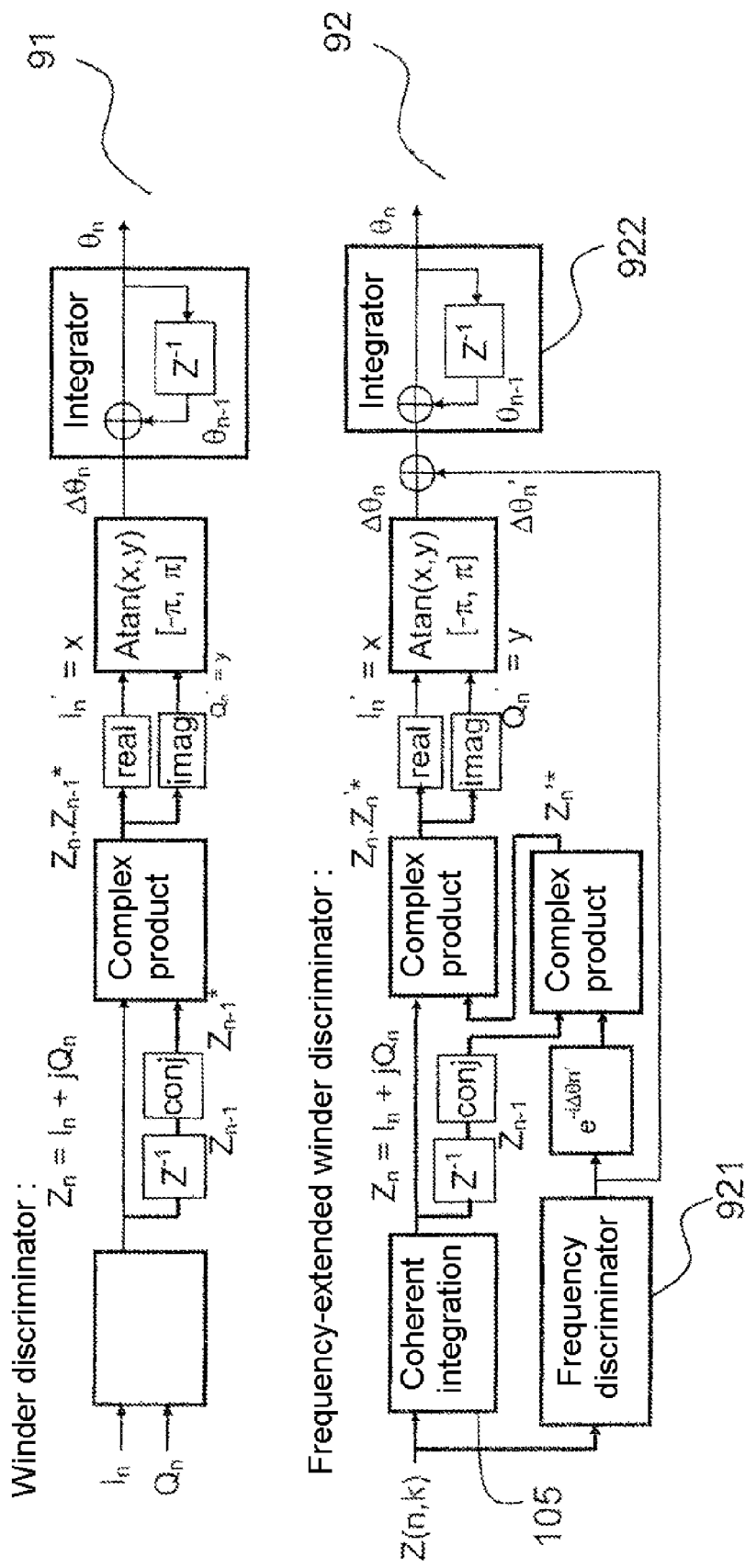
FIG. 8, a comparative block diagram of a "winder" phase discriminator and of a phase discriminator according to the invention.

FIG. 8 shows diagrammatically for comparative purposes a block diagram of a "winder" phase discriminator 91 and an overview of a phase discriminator 92 according to the invention. The latter uses a frequency discriminator 921 applied to the complex signal Z(n,k) received before coherent integration at a higher sampling frequency. Applying the frequency discriminator to the input signal of the means 105 of coherent integration makes it possible to estimate a higher Doppler frequency than if it were applied to the output signal of the said means 105 which exhibit a low sampling frequency due to the sub-sampling performed by the means of coherent integration 105. The means 105 can also be separated into two successive stages as will be explained further on in the description. A first stage performs a coherent integration over a duration $T_0$ for example a duration of 1 ms, the result of which is used by the frequency discriminator 921 and then a second stage finalizes the coherent integration over a duration $T_1$, for example a duration of 20 ms which corresponds to the sampling period of the signal processing software which executes the phase discriminator according to the invention.

The frequency discriminator 921 produces as output an estimate of predictable phase error variation $\Delta'\theta_n$ which is utilized in accordance with relations (1) and (2) to produce the signals $I'_n$ and $Q'_n$ on the basis of which the variation in non-predictable phase error $\Delta\theta_n$ is computed. The latter is added to the predictable phase error variation $\Delta'\theta_n$ delivered as output from the frequency discriminator 921 so as to produce an accurate global phase error variation estimate which is thereafter produced at the input of an integrator 922.

The principle used for the construction of the frequency discriminator according to the invention is now explained.

The means 105 of coherent integration carry out notably a coherent integration of the demodulated received signal over a time interval of duration $T_1$. This interval is cut up into a number M of elementary integration sub-intervals of duration $T_0$. The integration means 105 provide the phase discriminator according to the invention with the results of the coherent integrations over a duration $T_1$, which is performed by the software part of the demodulation system described in FIG. 1. In parallel, two filters, left and right, which carry out two symmetric Doppler frequency error hypotheses, are applied to the results of the coherent integrations over a duration $T_0$ so as to construct a frequency discriminator making it possible to extrapolate the phase error variation.

Figure 9:
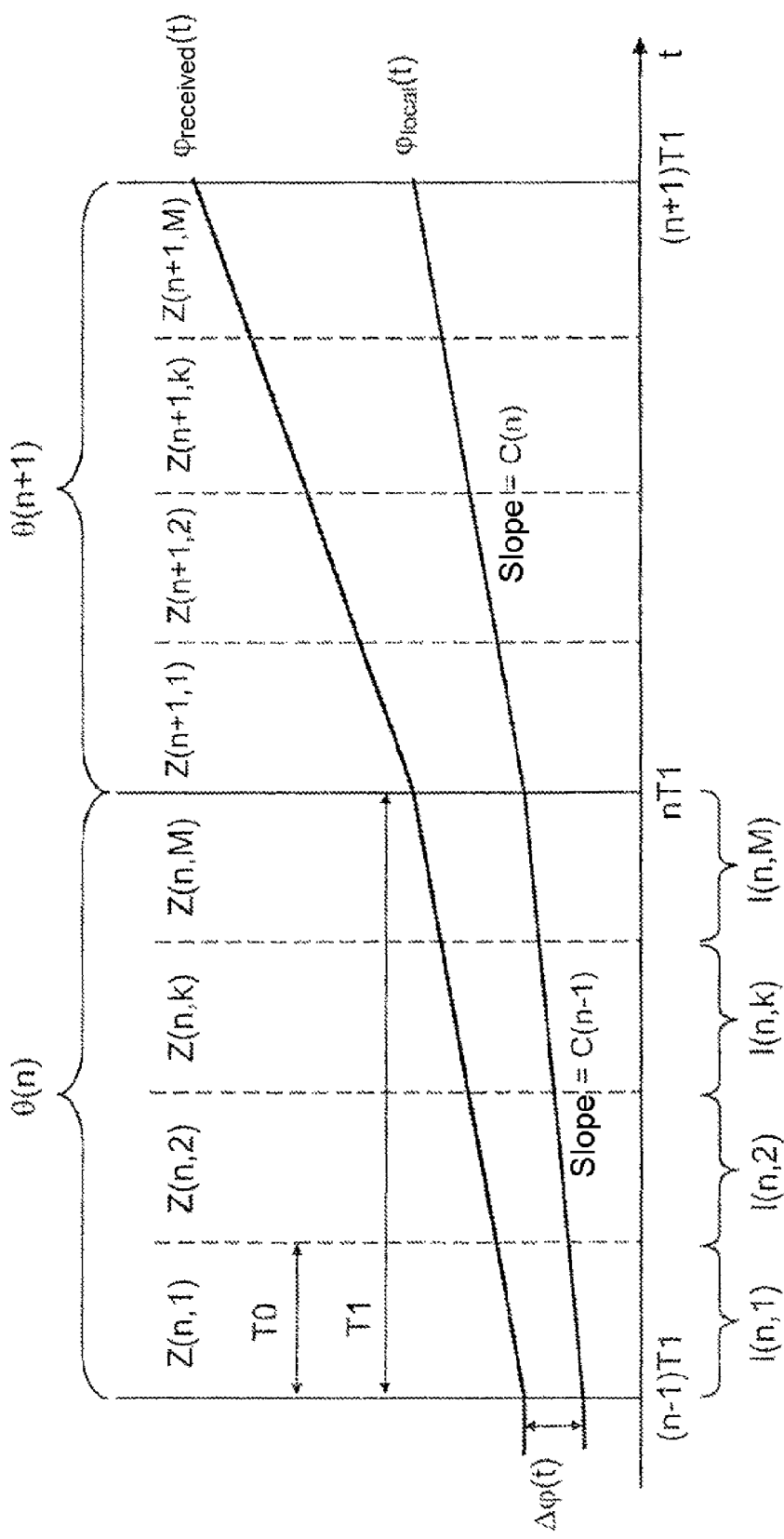
FIG. 9, a basic diagram of the trend of the phase error over coherent integration sub-intervals.

FIG. 9 shows diagrammatically the trend of the phase of the received signal $\phi_{received}(t)$ on the one hand and of the local phase $\phi_{local}(t)$ on the other hand. $F_e = 1/T_1$ is the sampling frequency, or processing frequency, of the phase discriminator device according to the invention. The symbol Z(n) of phase $\theta(n)$ is spread over the whole of the interval of duration $T_1$. Its phase $\theta(n)$ corresponds to the mean phase over this time interval. The interval $[(n-1)T_1 \; nT_1]$ is cut up into a number M of sub-intervals I(n,k) of duration $T_0$ for which a symbol Z(n,k) is produced by the integration means 105 which thus carry out a piecewise integration.

A first Doppler error hypothesis corresponding to the frequency $F_0 = F_e/2 = 1/(2T_1)$ is carried out on the basis of the symbols Z(n,k):

$$Z_{+1}(n) = \sum_{k=0}^{M-1} Z(n,k) e^{+j\pi \frac{k}{M}}$$

A second Doppler error hypothesis corresponding to the frequency $-F_0$ is also carried out:

$$Z_{-1}(n) = \sum_{k=0}^{M-1} Z(n,k) e^{-j\pi \frac{k}{M}}$$

Figure 10:
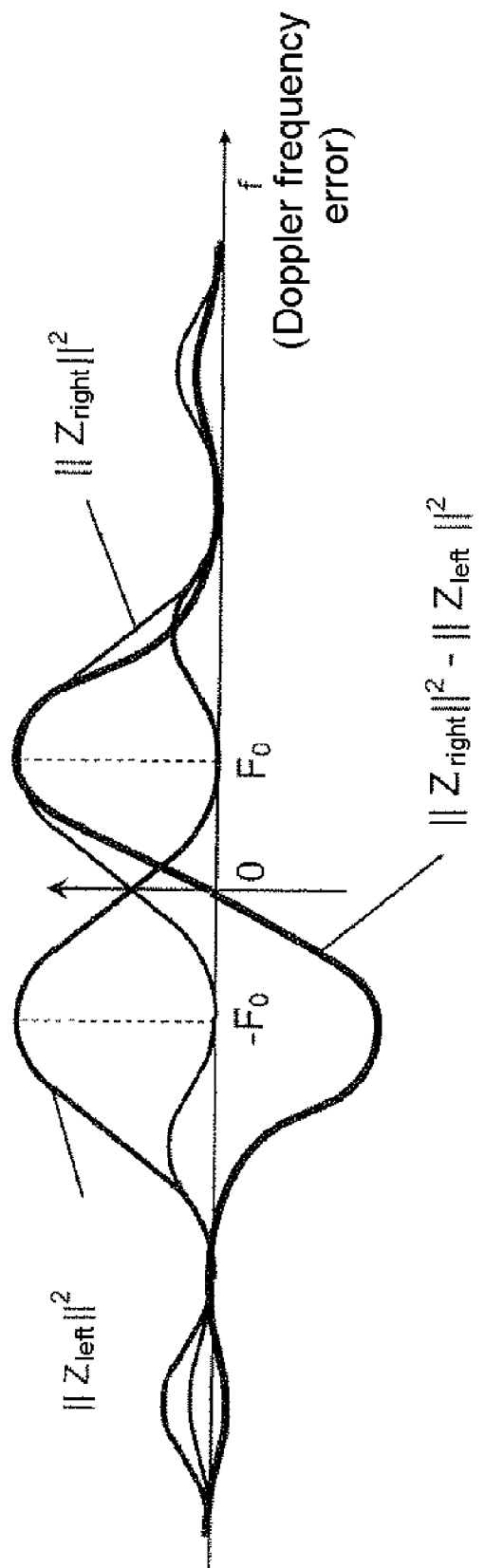
FIG. 10, an illustration of the principle used to construct the frequency discriminator according to the invention.

Computation of the quantity $\|Z_{+1}(n)\|^2 - \|Z_{-1}(n)\|^2$ makes it possible to obtain a frequency error estimate proportional to the Doppler frequency error if the latter remains limited to the linear zone between $-F_0$ and $+F_0$ such as is illustrated in FIG. 10.

The frequency discriminator according to the invention produces as output the following estimate expressed in Hertz:

$$Discri_{Frequency}(n) = \frac{\{\|Z_{+1}(n)\|^2 - \|Z_{-1}(n)\|^2\}}{(32CT_1/\pi^2)}$$

with C the power of the signal received, as estimated for example by way of the following relation $C = \|Z(n)\|^2$.

In another embodiment of the invention, a third Doppler error hypothesis, termed centred, is utilized. This hypothesis is determined by the following relation:

$$Z_0(n) = \sum_{k=0}^{M-1} Z(n,k) = Z(n)$$

In this case the frequency discriminator according to the invention produces as output the following estimate expressed in Hertz:

$$Discri_{Frequency}(n) = \frac{\text{Re}[(Z_{+1}(n) - Z_{-1}(n)) \cdot Z_0(n)^*]}{(16CT_1/\pi^2)}$$

with $Z_0(n)^*$, the complex conjugate of $Z_0(n)$.

Figure 11:
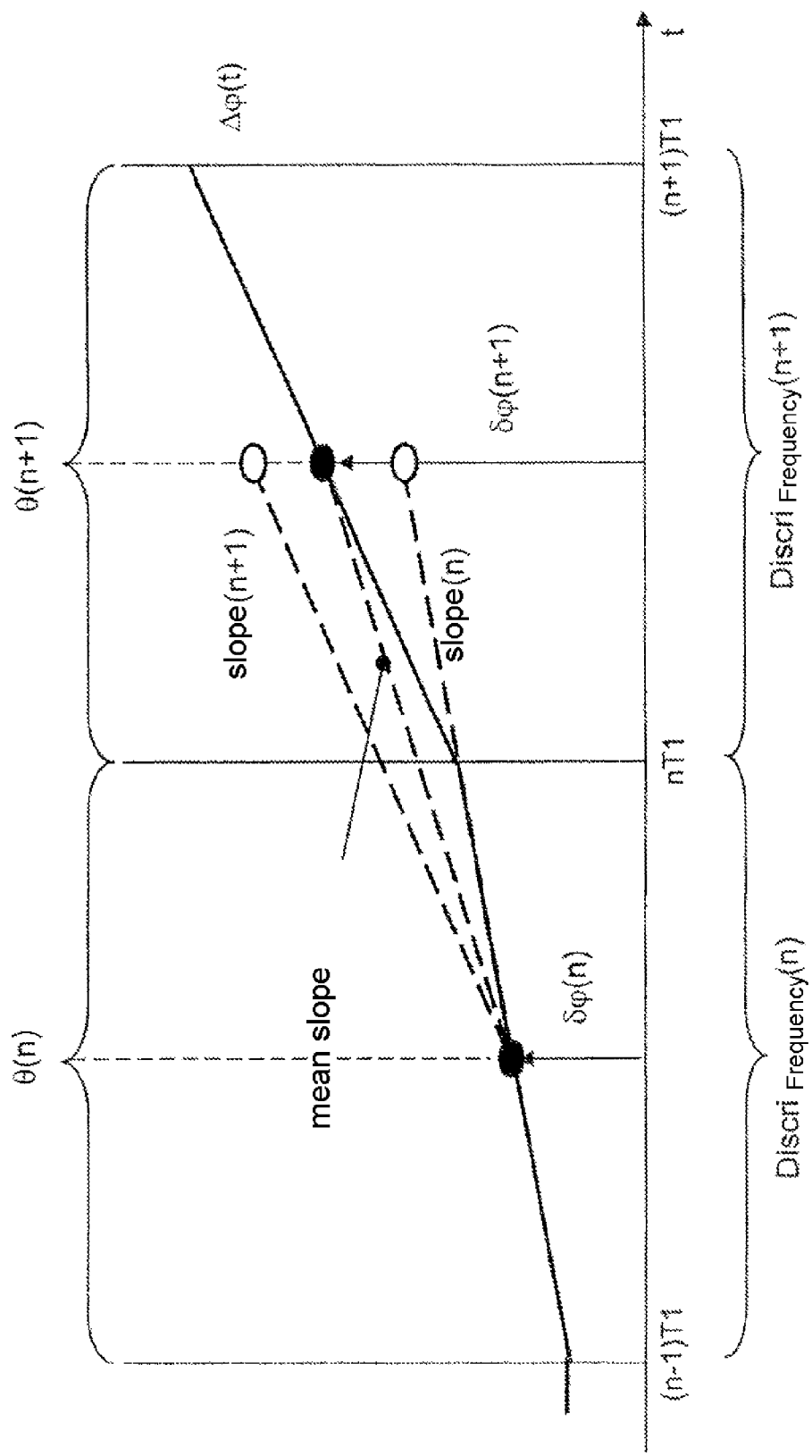
FIG. 11, an illustration of a variant of a frequency discriminator according to the invention.

FIG. 11 illustrates another embodiment of the frequency discriminator according to the invention. At the instant $(n+1)T_1$, the estimates $Discri_{frequency}(n)$ and $Discri_{frequency}(n+1)$ of the phase variations at the instants n and n+1 are available. $Discri_{frequency}(n)$ is representative of the variation of the phase error over the time interval $[(n-1)T_1 \; nT_1]$ and $Discri_{frequency}(n+1)$ is representative of the variation of the phase error over the time interval $[nT_1 \; (n+1)T_1]$. These two estimates are represented in FIG. 11 respectively by the slopes of the straight lines followed by the phase error $\delta\phi$ as a function of time over each interval of duration $T_1$. In order to improve the accuracy of the frequency discriminator, the average of two successive estimations is used so as to produce as output the following result:

$$\frac{Discri_{Frequency}(n) + Discri_{Frequency}(n+1)}{2}$$

In another embodiment of the invention, the frequency discriminator output computed at the instant $(n-1)T_1$ is used to correct the left and right Doppler error hypotheses performed initially at the frequencies $F_0$ and $-F_0$. The following relations are used:

$$Z_{+1}(n) = \sum_{k=0}^{M-1} Z(n,k) e^{+j\pi \frac{k}{M}} e^{-j2\pi \cdot Discri_{Frequency}(n-1)}$$

$$Z_{-1}(n) = \sum_{k=0}^{M-1} Z(n,k) e^{-j\pi \frac{k}{M}} e^{-j2\pi \cdot Discri_{Frequency}(n-1)}$$

$$Discri_{Frequency}(n) = \frac{\text{Re}[(Z_{+1}(n) - Z_{-1}(n)) \cdot Z_0(n)^*]}{(16CT_1/\pi^2)} + Discri_{Frequency}(n-1)$$

Figure 12:
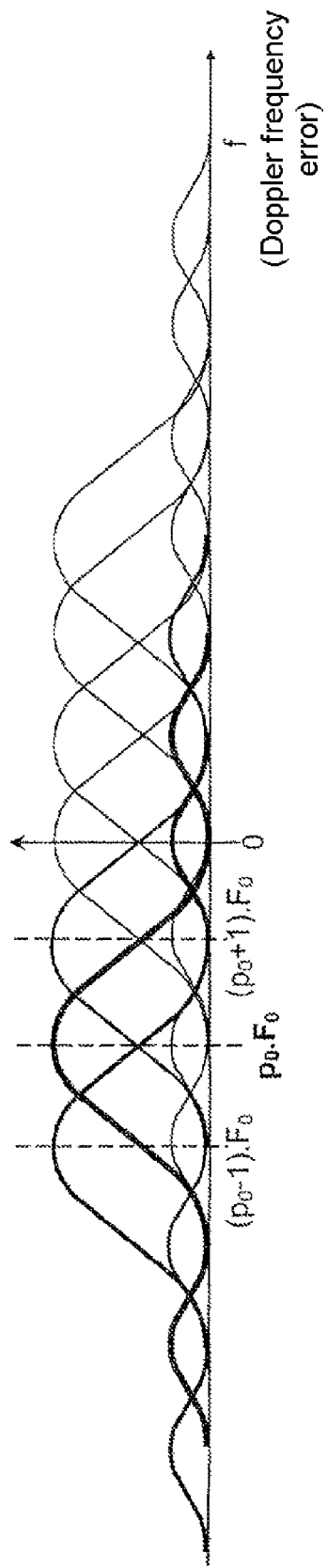
FIG. 12, an illustration of a third variant of a frequency discriminator according to the invention.

In another embodiment of the invention, such as illustrated in FIG. 12, in order to further widen the operating domain in terms of velocity slackness error of the phase discriminator, a number S of Doppler error hypotheses are performed at the following frequency values: $-S\,F_0, \ldots, -2\,F_0, -F_0, 0, F_0, 2F_0, \ldots S F_0$.

These N hypotheses may be written in a general manner with the aid of the following relation:

$$Z_p(n) = \sum_{k=0}^{M-1} Z(n,k) e^{-j\pi \cdot p \frac{k}{m}}$$

for p varying $-S$ to S.

The index $p_0$ corresponding to the maximum value $\|Z_{p_0}(n)\|^2$ among all the computed hypotheses is retained so as to construct the frequency discriminator around this maximum with the aid of one of the following two relations:

$$Discri_{Frequency}(n) = \frac{\{\|Z_{p_0+1}(n)\|^2 - \|Z_{p_0-1}(n)\|^2\}}{(32CT_1/\pi^2)} + p_0 F_0$$

$$Discri_{Frequency}(n) = \frac{\text{Re}[(Z_{p_0+1}(n) - Z_{p_0-1}(n)) \cdot Z_{p_0}(n)^*]}{(16CT_1/\pi^2)} + p_0 F_0$$

In another embodiment of the invention, the use of the frequency discriminator is conditioned on the estimated signal-to-noise ratio. The frequency-extended phase discriminator according to the invention makes it possible to substantially increase the phase-wise operating zone of the phase-locked loop. However the use of the frequency discriminator is liable to render the phase loop less robust to thermal noise or to noise due to interference. To alleviate this drawback, the output of the frequency discriminator is forced to zero when the estimated signal-to-noise ratio falls below a given threshold, for example a threshold of 10 dB.

The estimation of the signal-to-noise ratio is performed on the basis of the Doppler error hypotheses previously computed on the basis of one of the following relations:

$$R\hat{S}B = \frac{\|Z_{P_0}(n)\|^2}{\sigma_b^2} \text{ or } R\hat{S}B = \frac{\|Z_0(n)\|^2}{\sigma_b^2}$$

where $\sigma_b^2$ is a noise estimation carried out by the receiver over the integration interval of duration $T_1$, for example, with the aid of the relation $$\sigma_b^2 = \sum_{k=0}^{M-1} \|Z_b(n,k)\|^2,$$

where $Z_b(n,k)$ are noise samples computed, over the time interval of duration $T_1$, on a dedicated demodulation channel containing only noise as output.

Figure 13:
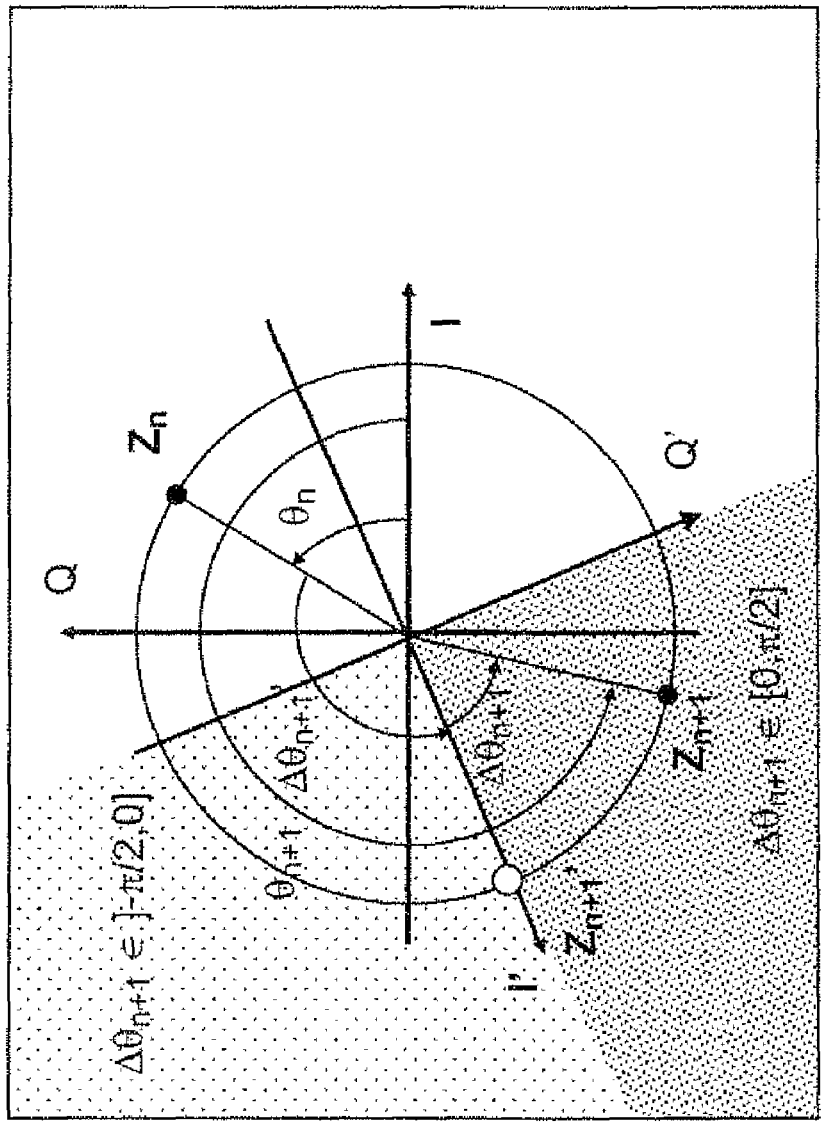
FIG. 13, an illustration of the operating principle of a phase discriminator according to the invention applied to a data channel.

FIG. 13 illustrates the operation of the phase discriminator according to the invention, applied to a data channel. The principle used is identical, except for the difference that the phase error $\Delta\theta_{n+1}$ exhibits an ambiguity of $\pi/2$ instead of $\pi$ in the case of a pilot channel. The tolerance to dynamics in phase error is therefore lower and the maximum phase error velocity for which the phase discriminator according to the invention will operate correctly is substantially half that in the case of a pilot channel.

In another embodiment of the invention, the second means of coherent integration 105 are removed and the frequency discriminator device 921 carries out an estimation of the frequency error directly on the basis of the signal received at the frequency $F_e$. The frequency error estimate can also be carried out by a device external to the invention and is in this case provided as input parameter to the phase discriminator according to the invention.

The present invention applies to all radionavigation receivers, and more broadly to any receiver including means for demodulating a carrier for which there is a desire to accurately estimate the phase or phase error. It makes it possible either to increase the resilience to phase dynamics while limiting the computational load, or to reduce the phase loop sampling frequency for equivalent performance.

In the case of a receiver suitable for demodulating a signal whose spectrum has not been spread, the means 105 of coherent integration are merged with filtering and sub-sampling means. In the case of a radionavigation receiver, the means 105 of coherent integration implicitly carry out sub-sampling of the signal.

The invention claimed is:

1. A phase discriminator device to receive as input a complex signal including an argument which represents a phase error $\Delta\phi$ and to produce as output an estimate $\theta_{n+1}$ of the phase error $\Delta\phi$ for signal samples $Z_{n+1}$ received, said device comprising:
a frequency discriminator; and
computation means for determining the phase estimate obtained at an instant $(N+1)T_1$ according to the following relations:

$$\theta_{n+1} = \theta_n + \Delta\theta_{n+1} + \Delta\theta'_{n+1}$$

$$\Delta\theta'_{n+1} = Discri_{Frequency}(n+1) \cdot 2\pi \cdot T_1$$

$$\Delta\theta_{n+1} = \arctan(I'_{n+1}, Q'_{n+1})$$

$$I'_{n+1} + jQ'_{n+1} = Z_{n+1} \cdot Z'^{*}_{n+1}$$

$$Z'_{n+1} = \exp(j\Delta\theta'_{n+1}) \cdot Z_n$$

wherein
$T_1$ is the time interval between two samples $Z_n$ and $Z_{n+1}$ received consecutively,
$Discri_{frequency}(n+1)$ is an estimate of the frequency error $\partial\Delta\phi/\partial t$ of said complex signal produced by the frequency discriminator, and
$Z'^{*}_{n+1}$ is the complex conjugate of $Z'_{n+}$.

2. The device according to claim 1, further comprising first means of coherent integration of said signal, said first means producing from M complex signal samples $Z_{n,k}$ at the frequency $F'_e = 1/T_0$ a complex sample $Z_n$ at the frequency $F_e = 1/T_1$, each time interval of duration $T_1$ subdivided into M time intervals of duration $T_0$, said frequency discriminator determining the frequency error estimate $Discri_{frequency}(n)$ on the basis of said signal samples $Z_{n,k}$.

3. The device according to claim 2, wherein said frequency discriminator comprises:
first means for computing at least two frequency error hypotheses at frequencies $-F_0$ and $+F_0$ with $F_0 = F_e/2$:

$$Z_{+1}(n) = \sum_{k=0}^{M-1} Z(n,k)e^{+j\pi\frac{k}{M}}, \text{ and}$$

$$Z_{-1}(n) = \sum_{k=0}^{M-1} Z(n,k)e^{-j\pi\frac{k}{M}};$$

and second means for computing the frequency error estimate according to one of the following two relations:

$$Discri_{Frequency}(n) = \frac{\{\|Z_{+1}(n)\|^2 - \|Z_{-1}(n)\|^2\}}{(32CT_1/\pi^2)}, \text{ and}$$

$$Discri_{Frequency}(n) = \frac{\text{Re}[(Z_{+1}(n) - Z_{-1}(n)) \cdot Z_0(n)^*]}{(16CT_1/\pi^2)},$$

wherein C is the estimated power of the received signal and $Z_0(n) = Z_n$.

4. The device according to claim 3, wherein the frequency error estimate is replaced with the average of the frequency error estimates obtained at the instants n and n+1.

5. The device according to claim 3, wherein
said frequency error hypotheses are corrected with the frequency error estimate obtained at the previous instant:

$$Z_{+1}(n) = \sum_{k=0}^{M-1} Z(n,k)e^{+j\pi\frac{k}{M}}e^{-j2\pi \cdot Discri_{Frequency}(n-1)}$$

$$Z_{-1}(n) = \sum_{k=0}^{M-1} Z(n,k)e^{-j\pi\frac{k}{M}}e^{-j2\pi \cdot Discri_{Frequency}(n-1)}, \text{ and}$$

the frequency error estimate determined at the instant n−1 is added to frequency error estimate obtained at the instant n.

6. The device according to claim 3, wherein
said first computation means carries out a number 2S of frequency error hypotheses at frequency values ranging from −SF$_0$ to +SF$_0$ in steps of F$_0$ according to the relations $$Z_{+p}(n) = \sum_{k=0}^{M-1} Z(n,k) e^{+j\pi p \frac{k}{M}} \text{ and}$$

$$Z_{-p}(n) = \sum_{k=0}^{M-1} Z(n,k) e^{-j\pi p \frac{k}{M}}, \text{ and}$$

said frequency discriminator further comprises means for determining an index p$_0$ associated with the maximum value $$\|Z_{p_0}(n)\|^2$$

in the set [−(S−1)..., −2, −1, 0, 1, 2, ... (S−1)], with Z$_0$(n)=Z$_n$ and that the frequency error estimate is determined according to one of the following two relations:

$$Discri_{Frequency}(n) = \frac{\{\|Z_{p_0+1}(n)\|^2 - \|Z_{p_0-1}(n)\|^2\}}{(32CT_1/\pi^2)} + p_0 F_0 \text{ or}$$

$$Discri_{Frequency}(n) = \frac{\text{Re}[(Z_{p_0+1}(n) - Z_{p_0-1}(n)) \cdot Z_{p_0}(n)^*]}{(16CT_1/\pi^2)} + p_0 F_0.$$

7. The device according to claim 6, further comprising:
means for estimating the signal-to-noise ratio $$R\hat{S}B;$$

means for comparing the signal-to-noise ratio with a threshold predetermined as a function of a compromise between the extent of the frequency range of said device and its resistance to noise; and
means for deactivating and activating said frequency discriminator as a function of the result of the comparing.

8. The device according to claim 7, further comprising means for estimating the noise power $\sigma_b^2$ according to the relation $$\sigma_b^2 = \sum_{k=0}^{M-1} \|Z_b(n,k)\|^2$$

with $Z_b(n, k)$ being measured noise samples and wherein the signal-to-noise ratio is estimated according to one of the following relations:

$$R\hat{S}B = \frac{\|Z_{p_0}(n)\|^2}{\sigma_b^2} \text{ or } R\hat{S}B = \frac{\|Z_0(n)\|^2}{\sigma_b^2}.$$

9. A device for receiving satellite radionavigation signals to receive a continuous signal modulated by a carrier, of phase $\phi_{received}$, said device comprising:

means for generating a local carrier, of phase $\phi_{local}$;
means for demodulating and filtering said signal;
means for coherent integration of said signal, wherein M samples $Z_{n,k}$ are output at a sampling frequency F$_e$; and
a phase-locked loop comprising a phase discriminator device according to claim 1, which receives as input a complex signal having and argument which represents the phase error $\Delta\phi=\phi_{local}-\phi_{received}$ and which locks the phase $\phi_{local}$ of the local carrier onto the phase $\phi_{received}$ of the received carrier.

10. A device for receiving satellite radionavigation signals to receive a continuous signal modulated by a carrier, of phase $\phi_{received}$, said device comprising:
means for generating a local carrier, of phase $\phi_{local}$;
means for demodulating and filtering said signal;
means for coherent integration of said signal, wherein M samples $Z_{n,k}$ are output at a sampling frequency F'$_e$; and
a phase-locked loop comprising a phase discriminator device according to claim 2, which receives as input a complex signal having and argument which represents the phase error $\Delta\phi=\phi_{local}-\phi_{received}$ and which locks the phase $\phi_{local}$ of the local carrier onto the phase $\phi_{received}$ of the received carrier.

11. A device for receiving satellite radionavigation signals to receive a continuous signal modulated by a carrier, of phase $\phi_{received}$, said device comprising:
means for generating a local carrier, of phase $\phi_{local}$;
means for demodulating and filtering said signal;
means for coherent integration of said signal, wherein M samples $Z_{n,k}$ are output at a sampling frequency F'$_e$; and
a phase-locked loop comprising a phase discriminator device according to claim 3, which receives as input a complex signal having and argument which represents the phase error $\Delta\phi=\phi_{local}-\phi_{received}$ and which locks the phase $\phi_{local}$ of the local carrier onto the phase $\phi_{received}$ of the received carrier.

12. A device for receiving satellite radionavigation signals to receive a continuous signal modulated by a carrier, of phase $\phi_{received}$, said device comprising:
means for generating a local carrier, of phase $\phi_{local}$;
means for demodulating and filtering said signal;
means for coherent integration of said signal, wherein M samples $Z_{n,k}$ are output at a sampling frequency F'$_e$; and
a phase-locked loop comprising a phase discriminator device according to claim 4, which receives as input a complex signal having and argument which represents the phase error $\Delta\phi=\phi_{local}-\phi_{received}$ and which locks the phase $\phi_{local}$ of the local carrier onto the phase $\phi_{received}$ of the received carrier.

13. A device for receiving satellite radionavigation signals to receive a continuous signal modulated by a carrier, of phase $\phi_{received}$, said device comprising:
means for generating a local carrier, of phase $\phi_{local}$;
means for demodulating and filtering said signal;
means for coherent integration of said signal, wherein M samples $Z_{n,k}$ are output at a sampling frequency F'$_e$; and
a phase-locked loop comprising a phase discriminator device according to claim 5, which receives as input a complex signal having and argument which represents the phase error $\Delta\phi=\phi_{local}-\phi_{received}$ and which locks the phase $\phi_{local}$ of the local carrier onto the phase $\phi_{received}$ of the received carrier.

14. A device for receiving satellite radionavigation signals to receive a continuous signal modulated by a carrier, of phase $\phi_{received}$, said device comprising:
means for generating a local carrier, of phase $\phi_{local}$;
means for demodulating and filtering said signal;

means for coherent integration of said signal, wherein M samples $Z_{n,k}$ are output at a sampling frequency $F'_e$; and a phase-locked loop comprising a phase discriminator device according to claim 6, which receives as input a complex signal having and argument which represents the phase error $\Delta\phi=\phi_{local}-\phi_{received}$ and which locks the phase $\phi_{local}$ of the local carrier onto the phase $\phi_{received}$ of the received carrier.

15. A device for receiving satellite radionavigation signals to receive a continuous signal modulated by a carrier, of phase $\phi_{received}$, said device comprising:

means for generating a local carrier, of phase $\phi_{local}$;

means for demodulating and filtering said signal;

means for coherent integration of said signal, wherein M samples $Z_{n,k}$ are output at a sampling frequency $F'_e$; and a phase-locked loop comprising a phase discriminator device according to claim 7, which receives as input a complex signal having and argument which represents the phase error $\Delta\phi=\phi_{local}-\phi_{received}$ and which locks the phase $\phi_{local}$ of the local carrier onto the phase $\phi_{received}$ of the received carrier.

16. A device for receiving satellite radionavigation signals to receive a continuous signal modulated by a carrier, of phase $\phi_{received}$, said device comprising:

means for generating a local carrier, of phase $\phi_{local}$;

means for demodulating and filtering said signal;

means for coherent integration of said signal, wherein M samples $Z_{n,k}$ are output at a sampling frequency $F'_e$; and a phase-locked loop comprising a phase discriminator device according to claim 8, which receives as input a complex signal having and argument which represents the phase error $\Delta\phi=\phi_{local}-\phi_{received}$ and which locks the phase $\phi_{local}$ of the local carrier onto the phase $\phi_{received}$ of the received carrier.

* * * * *